US009660589B2

(12) United States Patent
Kondo et al.

(10) Patent No.: US 9,660,589 B2
(45) Date of Patent: May 23, 2017

(54) POWER AMPLIFIER MODULE

(71) Applicant: Murata Manufacturing Co., Ltd., Kyoto (JP)

(72) Inventors: Masao Kondo, Kyoto (JP); Hidetoshi Matsumoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/077,124

(22) Filed: Mar. 22, 2016

(65) Prior Publication Data

US 2016/0294328 A1 Oct. 6, 2016

(30) Foreign Application Priority Data

Mar. 30, 2015 (JP) .................. 2015-070089

(51) Int. Cl.
*H03F 3/04* (2006.01)
*H03F 1/02* (2006.01)
*H03F 3/19* (2006.01)
*H03F 3/24* (2006.01)
*H03F 3/21* (2006.01)

(52) U.S. Cl.
CPC ......... *H03F 1/0222* (2013.01); *H03F 1/0227* (2013.01); *H03F 1/0261* (2013.01); *H03F 1/0277* (2013.01); *H03F 3/19* (2013.01); *H03F 3/211* (2013.01); *H03F 3/245* (2013.01); *H03F 2200/102* (2013.01); *H03F 2200/105* (2013.01); *H03F 2200/222* (2013.01); *H03F 2200/318* (2013.01); *H03F 2200/387* (2013.01); *H03F 2200/451* (2013.01); *H03F 2203/21131* (2013.01)

(58) Field of Classification Search
CPC ........................................................ H03F 3/04
USPC ........................................ 330/296, 285, 302
See application file for complete search history.

(56) References Cited

U.S. PATENT DOCUMENTS

| 6,583,667 B1* | 6/2003 | Dasgupta | H03F 1/301 330/254 |
| 7,151,409 B2* | 12/2006 | Koen | H03F 3/45183 330/254 |
| 7,215,203 B2* | 5/2007 | Matsunaga | H03F 1/0261 330/133 |

(Continued)

FOREIGN PATENT DOCUMENTS

| JP | 2005-045440 A | 2/2005 |
| JP | 2005-513943 A | 5/2005 |

*Primary Examiner* — Henry Choe
(74) *Attorney, Agent, or Firm* — Pearne & Gordon, LLP

(57) ABSTRACT

A power amplifier module includes an amplifier transistor and a bias circuit. A first power supply voltage based on a first operation mode or a second power supply voltage based on a second operation mode is supplied to the amplifier transistor. The amplifier transistor receives a first signal and outputs a second signal obtained by amplifying the first signal. The bias circuit supplies a bias current to the amplifier transistor. The bias circuit includes first and second resistors and first and second transistors. The first transistor is connected in series with the first resistor and is turned ON by a first bias control voltage which is supplied when the first operation mode is used. The second transistor is connected in series with the second resistor and is turned ON by a second bias control voltage which is supplied when the second operation mode is used.

18 Claims, 16 Drawing Sheets

(56) References Cited

U.S. PATENT DOCUMENTS

| | | | |
|---|---|---|---|
| 7,573,336 B2* | 8/2009 | Ishimaru | H03F 1/302 330/288 |
| 8,248,163 B2* | 8/2012 | Wang | H03F 1/0261 330/296 |
| 8,354,888 B2* | 1/2013 | Matsuzuka | H03F 1/0261 330/285 |
| 8,432,227 B2* | 4/2013 | Okamura | H03F 1/0261 330/285 |
| 8,688,061 B2* | 4/2014 | Green | H03F 1/0261 330/285 |
| 2005/0151586 A1 | 7/2005 | Grillo | |

* cited by examiner

POWER AMPLIFIER MODULE

BACKGROUND

The present disclosure relates to a power amplifier module.

In mobile communication devices, such as cellular phones, a power amplifier module for amplifying power of a signal to be transmitted to a base station is used. Nowadays, in cellular phones, modulation methods using standards for high-speed data communication, such as HSUPA (High-Speed Uplink Packet Access), LTE (Long Term Evolution), and LTE-Advanced, are being used. In these communication standards, for enhancing the communication speed, it is desirable to decrease a phase deviation and an amplitude deviation. Accordingly, it is necessary that a power amplifier module implement high linearity. In the above-described communication standards, for achieving the enhanced communication speed, the range in which the amplitude of a signal changes (dynamic range) is usually wide. For maintaining high linearity even in the case of a wide dynamic range, a high power supply voltage is necessary, and this is likely to increase the power consumption in a power amplifier module.

On the other hand, in cellular phones, for increasing the maximum talk time or the maximum communication time, it is desirable to decrease the power consumption. For example, Japanese Unexamined Patent Application Publication (Translation of PCT Application) No. 2005-513943 discloses a power amplifier module utilizing the envelope tracking technique. In the envelope tracking technique, by adjusting the power supply voltage in accordance with the amplitude level of an input modulation signal, the power efficiency is improved.

BRIEF SUMMARY

Envelope tracking is effective particularly for enhancing power-added efficiency when a power amplifier is operating under high power. On the other hand, when a power amplifier is operating under low power, another technique, such as average power tracking, is sometimes used for improving the linearity of the gain.

Generally, a power amplifier module includes a bias circuit for supplying bias to a power amplifier transistor. The bias circuit includes a transistor at its base to which a bias control voltage is supplied and a ballast resistor connected to the emitter of the transistor. A suitable value of the bias control voltage and a suitable resistance value of the ballast resistor of a power amplifier module vary in accordance with the operation mode and the output level of the power amplifier module. It is thus difficult to provide the optimal bias circuit adjusted to all operation modes.

The present disclosure has been made in view of such a background. Accordingly, the present disclosure suitably controls bias to be supplied to an amplifier transistor in a power amplifier module that is operable in multiple operation modes.

According to embodiments of the present disclosure, there is provided a power amplifier module including an amplifier transistor and a bias circuit. A first power supply voltage based on a first operation mode or a second power supply voltage based on a second operation mode is supplied to the amplifier transistor. The amplifier transistor receives a first signal and outputs a second signal obtained by amplifying the first signal. The bias circuit supplies a bias current to the amplifier transistor. The bias circuit includes first and second resistors and first and second transistors. The first transistor is connected in series with the first resistor and is turned ON by a first bias control voltage which is supplied when the first operation mode is used. The second transistor is connected in series with the second resistor and is turned ON by a second bias control voltage which is supplied when the second operation mode is used.

According to embodiments of the present disclosure, it is possible to suitably control bias to be supplied to an amplifier transistor in a power amplifier module that is operable in multiple operation modes.

Other features, elements, characteristics and advantages of the present disclosure will become more apparent from the following detailed description of embodiments of the present disclosure with reference to the attached drawings.

DETAILED DESCRIPTION

Figure 1:
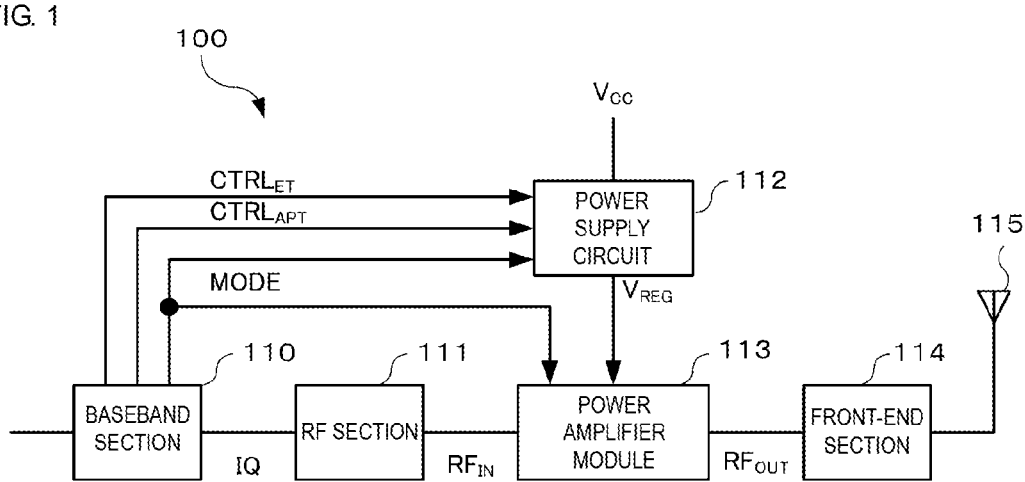
FIG. 1 illustrates an example of the configuration of a transmitting unit including a power amplifier module, which is an embodiment of the present disclosure.

An embodiment of the present disclosure will be described below with reference to the accompanying drawings. FIG. 1 illustrates an example of the configuration of a transmitting unit 100 that includes a power amplifier module 113, which is an embodiment of the present disclosure. The transmitting unit 100 is used for transmitting various signals, such as audio and data signals, to a base station, in a mobile communication device, such as a cellular phone. The transmitting unit 100 supports multiple radio frequency (RF) bands (multiband). The mobile communication device also includes a receiving unit for receiving signals from a base station. However, an explanation of the receiving unit will be omitted.

As shown in FIG. 1, the transmitting unit 100 includes a baseband section 110, an RF section 111, a power supply circuit 112, a power amplifier module 113, a front-end section 114, and an antenna 115.

The baseband section 110 modulates an input signal, such as an audio signal or a data signal, on the basis of a modulation method, such as HSUPA or LTE, and outputs a modulation signal. In this embodiment, a modulation signal output from the baseband section 110 is an IQ signal (I (In-phase) signal and Q (Quadrature) signal) representing the amplitude and the phase on an IQ plane. The frequency of an IQ signal is, for example, about several MHz to several tens of MHz.

The baseband section 110 also outputs a mode signal MODE which specifies an operation mode of the power amplifier module 113. In this embodiment, the power amplifier module 113 is operable in the envelope tracking (ET) mode and the average power tracking (APT) mode. If the output of the power amplifier module 113 is a predetermined level or higher, the baseband section 110 outputs a mode signal MODE which specifies the ET mode. If the output of the power amplifier module 113 is lower than the predetermined level, the baseband section 110 outputs a mode signal MODE which specifies the APT mode.

The baseband section 110 also outputs a control signal for controlling the power supply voltage in accordance with the operation mode of the power amplifier module 113. More specifically, in the case of the ET mode, the baseband section 110 detects the amplitude level of a modulation signal on the basis of the IQ signal, and outputs a power supply control signal $CTRL_{ET}$ to the power supply circuit 112 so that a power supply voltage $V_{REG}$ to be supplied to the power amplifier module 113 will be at a level corresponding to the amplitude level of an RF signal. On the other hand, in the case of the APT mode, the baseband section 110 outputs a power supply control signal $CTRL_{APT}$ to the power supply circuit 112 so that a power supply voltage $V_{REG}$ to be supplied to the power amplifier module 113 will be at a level corresponding to the average power of the power amplifier module 113.

The RF section 111 generates an RF signal ($RF_{IN}$) used for performing radio transmission from the IQ signal output from the baseband section 110. The frequency of the RF signal is about several hundreds of MHz to several GHz. In this case, instead of performing direct conversion from the IQ signal into the RF signal, the RF section 111 may first convert the IQ signal into an IF (Intermediate Frequency) signal and then convert the IF signal into the RF signal.

The power supply circuit 112 generates a power supply voltage $V_{REG}$ at a level corresponding to the operation mode, on the basis of the mode signal MODE and the power supply control signal $CTRL_{ET}$ or $CTRL_{APT}$, and supplies the generated power supply voltage $V_{REG}$ to the power amplifier module 113. More specifically, in the case of the ET mode, the power supply circuit 112 generates a power supply voltage $V_{REG}$ (first power supply voltage) corresponding to the power supply control signal $CTRL_{ET}$. In the case of the APT mode, the power supply circuit 112 generates a power supply voltage $V_{REG}$ (second power supply voltage) corresponding to the power supply control signal $CTRL_{APT}$. The power supply circuit 112 may include a DC-to-DC converter which generates a power supply voltage $V_{REG}$ at a desired level from an input voltage (for example, a battery voltage $V_{BAT}$).

The power amplifier module 113 amplifies power of the RF signal ($RF_{IN}$) output from the RF section 111 to a level which is high enough to be transmitted to a base station, on the basis of the power supply voltage $V_{REG}$ supplied from the power supply circuit 112, and outputs an amplified signal ($RF_{OUT}$).

The front-end section 114 performs filtering on the amplified signal ($RF_{OUT}$) and switching between the amplified signal ($RF_{OUT}$) and a signal received from a base station. The amplified signal output from the front-end section 114 is transmitted to the base station via the antenna 115.

Figure 2:
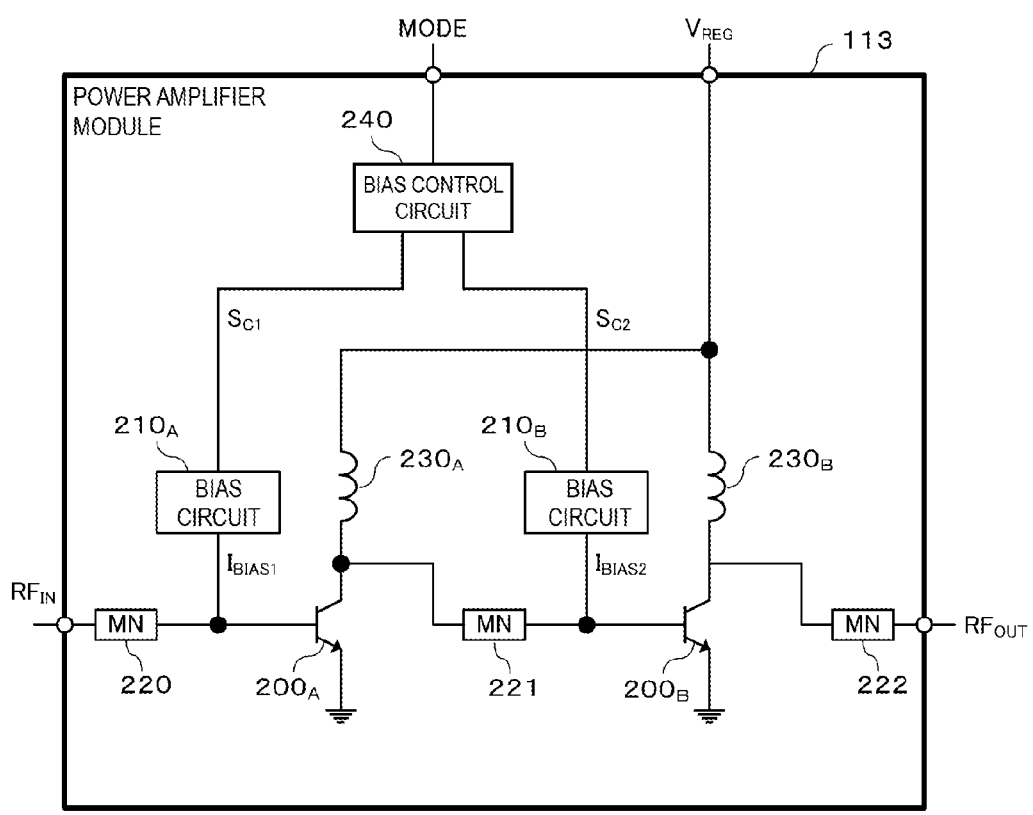
FIG. 2 illustrates an example of the configuration of a power amplifier module.

FIG. 2 illustrates an example of the configuration of the power amplifier module 113. As shown in FIG. 2, the power amplifier module 113 includes transistors $200_A$ and $200_B$, bias circuits $210_A$ and $210_B$, matching circuits 220, 221, and 222, inductors $230_A$ and $230_B$, and a bias control circuit 240.

The transistors $200_A$ and $200_B$ form a two-stage amplifier, which amplifies an input RF signal ($RF_{IN}$) and outputs an amplified signal ($RF_{OUT}$). The transistors $200_A$ and $200_B$ are each constituted by a bipolar transistor, for example, a heterojunction bipolar transistor (HBT). The first-stage (driving-stage) transistor $200_A$ amplifies the input RF signal ($RF_{IN}$) and outputs the amplified signal. The second-stage transistor $200_B$ amplifies the signal output from the transistor $200_A$ and outputs the amplified signal. The number of stages of the amplifier is not restricted to two, and may be one or three or more.

The bias circuits $210_A$ and $210_B$ supply bias to the transistors $200_A$ and $200_B$, respectively. The bias circuit $210_A$ supplies a bias current $I_{BIAS1}$ corresponding to a bias control signal $S_{C1}$ output from the bias control circuit 240 to the transistor $200_A$. The bias circuit $210_B$ supplies a bias current $I_{BIAS2}$ corresponding to a bias control signal $S_{C2}$ output from the bias control circuit 240 to the transistor $200_B$.

The matching circuits 220, 221, and 222 are disposed for performing impedance matching between circuits. The matching circuits 220, 221, and 222 are each constituted by, for example, inductors and capacitors.

The inductors $230_A$ and $230_B$ are disposed for the isolation of the RF signal. The power supply voltage $V_{REG}$ is supplied to the transistors $200_A$ and $200_B$ via the inductors $230_A$ and $230_B$, respectively. In the power amplifier module 113 shown in FIG. 2, the power supply voltage $V_{REG}$ is supplied to both of the transistors $200_A$ and $200_B$. However, the power supply voltage $V_{REG}$ may be supplied to only one of the transistors $200_A$ and $200_B$, and a power supply voltage of a predetermined level, for example, the battery voltage $V_{BAT}$, may be supplied to the other one of the transistors $200_A$ and $200_B$.

The bias control circuit 240 outputs the bias control signals $S_{C1}$ and $S_{C2}$ to the transistors $200_A$ and $200_B$, respectively, on the basis of the mode signal MODE so that bias to be supplied to the transistors $200_A$ and $200_B$ will be at a suitable level corresponding to the operation mode (ET/APT mode). The control operation using the bias control signals $S_{C1}$ and $S_{C2}$ will be discussed later. The bias control circuit 240 may be disposed outside of the power amplifier module 113.

Figure 3:
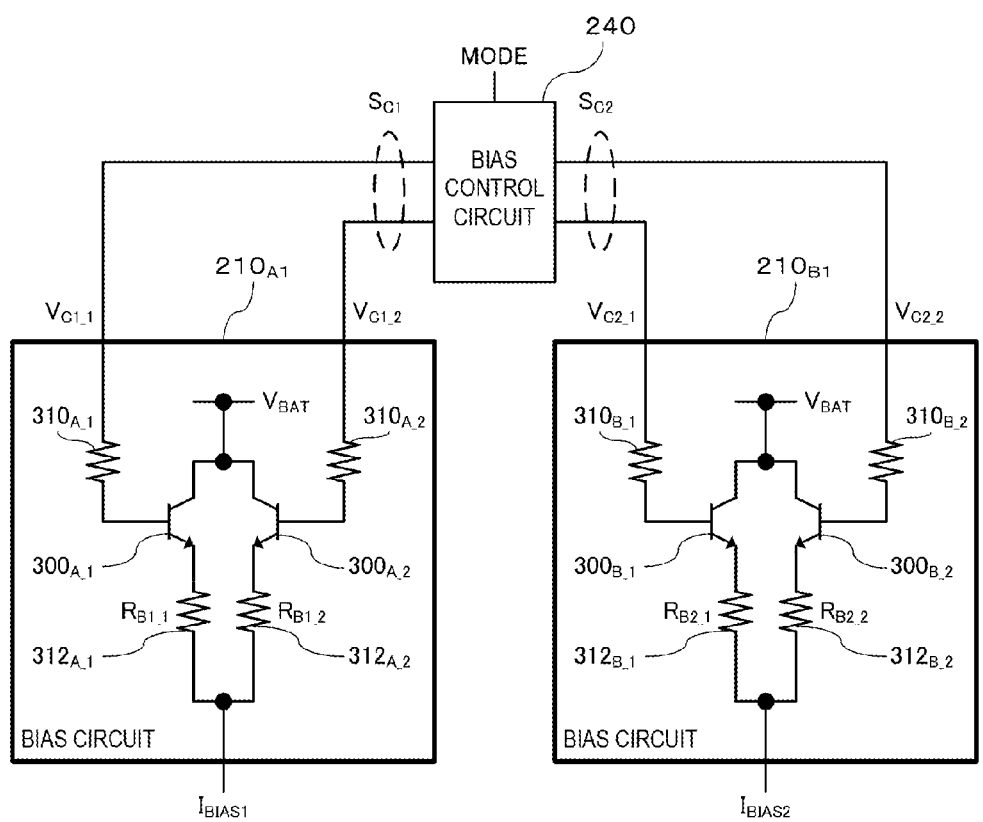
FIG. 3 illustrates an example of the configuration of bias circuits.

FIG. 3 illustrates an example of the configuration of the bias circuits $210_A$ and $210_B$. A bias circuit $210_{A1}$ includes transistors $300_{A\_1}$ and $300_{A\_2}$ (first and second transistors) and resistors $310_{A\_1}$, $310_{A\_2}$, $312_{A\_1}$ (first resistor), and $312_{A\_2}$ (second resistor). As shown in FIG. 3, the bias control signal $S_{C1}$ output from the bias control circuit 240 includes bias control voltages $V_{C1\_1}$ and $V_{C1\_2}$ (first and second bias control voltages), and the bias control signal $S_{C2}$ output from the bias control circuit 240 includes bias control voltages $V_{C2\_1}$ and $V_{C2\_2}$.

The transistors $300_{A\_1}$ and $300_{A\_2}$ are bipolar transistors, for example, HBTs. The bias control voltage $V_{C1\_1}$ is supplied to the base of the transistor $300_{A\_1}$ via the resistor $310_{A\_1}$. The bias control voltage $V_{C1\_2}$ is supplied to the base of the transistor $300_{A\_2}$ via the resistor $310_{A\_2}$. A power supply voltage of a predetermined level, for example the battery voltage $V_{BAT}$, is supplied to the collectors of the transistors $300_{A\_1}$ and $300_{A\_2}$.

One end of the resistor $312_{A\_1}$ is connected to the emitter of the transistor $300_{A\_1}$ and the other end thereof is connected to the base of the transistor $200_A$. That is, the resistor $312_{A\_1}$ is connected in series with the transistor $300_{A\_1}$. One end of the resistor $312_{A\_2}$ is connected to the emitter of the transistor $300_{A\_2}$ and the other end thereof is connected to the base of the transistor $200_A$. That is, the resistor $312_{A\_2}$ is connected in series with the transistor $300_{A\_2}$. The resistance value $R_{B1\_1}$ of the resistor $312_{A\_1}$ is different from the resistance value $R_{B1\_2}$ of the resistor $312_{A\_2}$.

In the bias circuit $210_{A1}$, one of the transistors $300_{A\_1}$ and $300_{A\_2}$ is turned ON under the control of the bias control voltages $V_{C1\_1}$ and $V_{C1\_2}$. Then, the bias current $I_{BIAS1}$ is output via one of the transistors $300_{A\_1}$ and $300_{A\_2}$ that is turned ON and the resistor $312_{A\_1}$ or $312_{A\_2}$ connected in series with this transistor. This control operation will be described below more specifically. For example, when the bias control voltage $V_{C1\_1}$ is at a high level and the bias control voltage $V_{C1\_2}$ is at a low level, the transistor $300_{A\_1}$ is turned ON and the transistor $300_{A\_2}$ is turned OFF. In this case, the bias circuit $210_{A1}$ outputs the bias current $I_{BIAS1}$ determined by the bias control voltage $V_{C1\_1}$ and the resistance value $R_{B1\_1}$. When the bias control voltage $V_{C1\_1}$ is at a low level and the bias control voltage $V_{C1\_2}$ is at a high level, the transistor $300_{A\_1}$ is turned OFF and the transistor $300_{A\_2}$ is turned ON. In this case, the bias circuit $210_{A1}$ outputs the bias current $I_{BIAS1}$ determined by the bias control voltage $V_{C1\_2}$ and the resistance value $R_{B1\_2}$.

The configuration of the bias circuit $210_{B1}$ is similar to that of the bias circuit $210_{A1}$. Elements of the bias circuit $210_{B1}$ equivalent to those of the bias circuit $210_{A1}$ are designated by like reference numerals, and an explanation thereof will be omitted. In the bias circuit $210_{B1}$, as well as in the bias circuit $210_{A1}$, the resistance value $R_{B2\_1}$ of the resistor $312_{B\_1}$ is different from the resistance value $R_{B2\_2}$ of the resistor $312_{B\_2}$.

In the bias circuit $210_{B1}$, for example, when the bias control voltage $V_{C2\_1}$ is at a high level and the bias control voltage $V_{C2\_2}$ is at a low level, the transistor $300_{B\_1}$ is turned ON and the transistor $300_{B\_2}$ is turned OFF. In this case, the bias circuit $210_{B1}$ outputs the bias current $I_{BIAS2}$ determined by the bias control voltage $V_{C2\_1}$ and the resistance value $R_{B2\_1}$. When the bias control voltage $V_{C2\_1}$ is at a low level and the bias control voltage $V_{C2\_2}$ is at a high level, the transistor $300_{B\_1}$ is turned OFF and the transistor $300_{B\_2}$ is turned ON. In this case, the bias circuit $210_{B1}$ outputs the bias current $I_{BIAS2}$ determined by the bias control voltage $V_{C2\_2}$ and the resistance value $R_{B2\_2}$.

In the power amplifier module 113, in the case of the ET mode, the bias control voltages $V_{C1\_1}$ and $V_{C2\_1}$ are made to have a high level, while the bias control voltages $V_{C1\_2}$ and $V_{C2\_2}$ are made to have a low level. In contrast, in the case of the APT mode, the bias control voltages $V_{C1\_1}$ and $V_{C2\_1}$ are made to have a low level, while the bias control voltages $V_{C1\_2}$ and $V_{C2\_2}$ are made to have a high level. With this control operation, the power amplifier module 113 is able to generate a bias current based on a suitable bias control voltage and a suitable resistance value corresponding to the operation mode. The value of the bias control voltage $V_{C1\_1}$ at a high level may be different from that of the bias control voltage $V_{C1\_2}$. For example, the bias control voltage $V_{C1\_1}$ at a high level (for example, about 2.85 V) may be higher than the bias control voltage $V_{C1\_2}$ at a high level (for example, about 2.8 V). The relationship between the bias control voltages $V_{C2\_1}$ and $V_{C2\_2}$ may be similar to that between the bias control voltages $V_{C1\_1}$ and $V_{C1\_2}$.

Figure 4A:
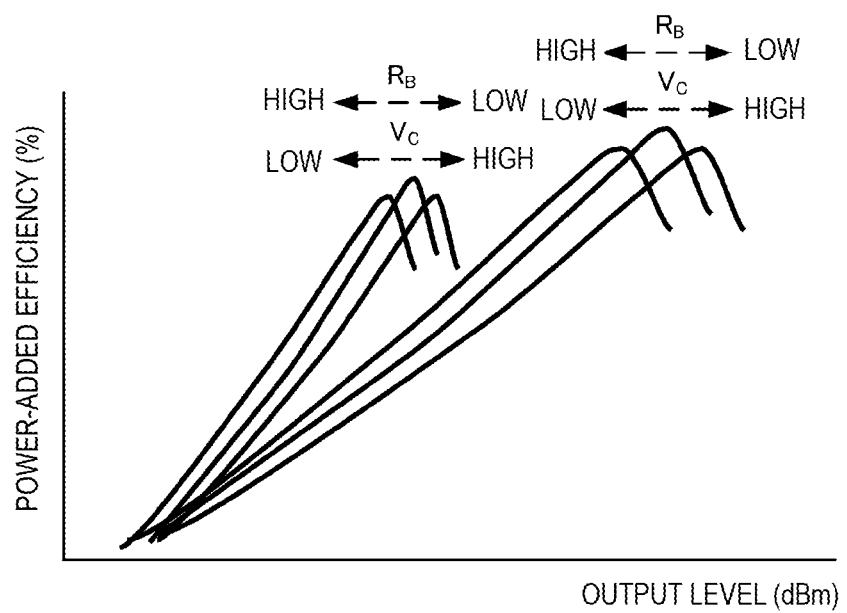
FIG. 4A is a graph illustrating an example of the relationship between the output level (dBm) and the power-added efficiency (%) when a power amplifier module is operating in the envelope tracking (ET) mode.

FIG. 4A is a graph illustrating an example of the relationship between the output level (dBm) and the power-added efficiency (%) when the power amplifier module 113 is operating in the ET mode. FIG. 4A shows a change in the power-added efficiency in accordance with the magnitudes of the bias control voltage $V_C$ (such as $V_{C1\_1}$ and $V_{C1\_2}$) and the resistance value $R_B$ (such as $R_{B1\_1}$ and $R_{B1\_2}$). In the ET mode, it is desirable to enhance the power-added efficiency. It is thus necessary to determine the bias control voltage $V_C$ and the resistance value $R_B$ so as to increase the power-added efficiency.

Figure 4B:
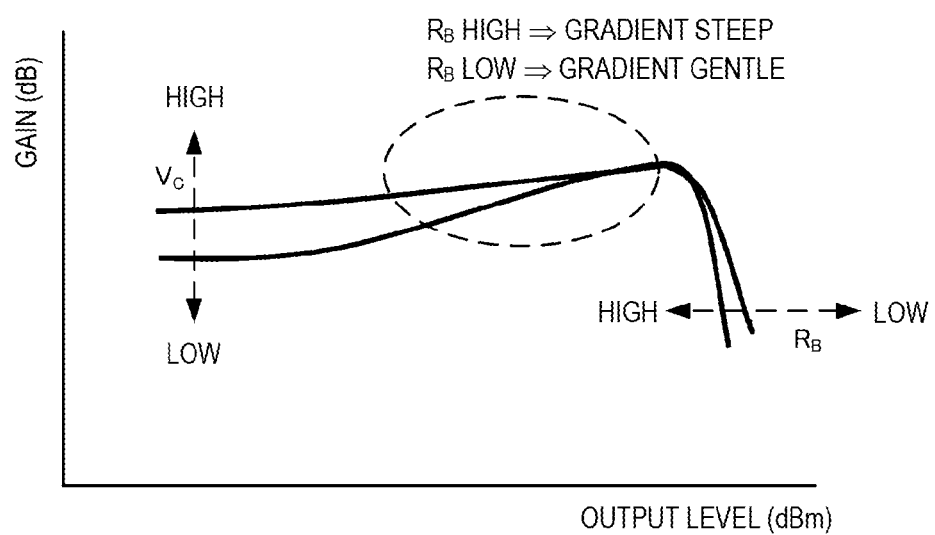
FIG. 4B is a graph illustrating an example of the relationship between the output level (dBm) and the gain (dB) when a power amplifier module is operating in the average power tracking (APT) mode.

FIG. 4B is a graph illustrating an example of the relationship between the output level (dBm) and the gain (dB) when the power amplifier module 113 is operating in the APT mode. FIG. 4B shows a change in the gain in accordance with the magnitudes of the bias control voltage $V_C$ (such as $V_{C1\_1}$ and $V_{C1\_2}$) and the resistance value $R_B$ (such as $R_{B1\_1}$ and $R_{B1\_2}$). In the APT mode, it is desirable to enhance the linearity. It is thus necessary to determine the bias control voltage $V_C$ and the resistance value $R_B$ so as to obtain high linearity.

As shown in FIGS. 4A and 4B, the reference to be used for determining the bias control voltage $V_C$ and the resistance value $R_B$ in the case of the ET mode is different from that in the case of the APT mode. Accordingly, the bias control voltage $V_C$ and the resistance value $R_B$ suitable for one of the ET mode and the APT mode are not necessarily the same as the bias control voltage $V_C$ and the resistance value $R_B$ suitable for the other mode. In terms of this point, in the power amplifier module 113, in each of the bias circuits $210_{A1}$ and $210_{B1}$, the suitable bias control voltage $V_C$ (for example, $V_{C1\_1}$ or $V_{C1\_2}$) and the suitable resistance value $R_B$ (for example, $R_{B1\_1}$ or $R_{B1\_2}$) can be selected in accordance with the operation mode. In this manner, in a power amplifier module which is operable in multiple operation modes, it is possible to control bias to be supplied to an amplifier transistor.

Figure 5:
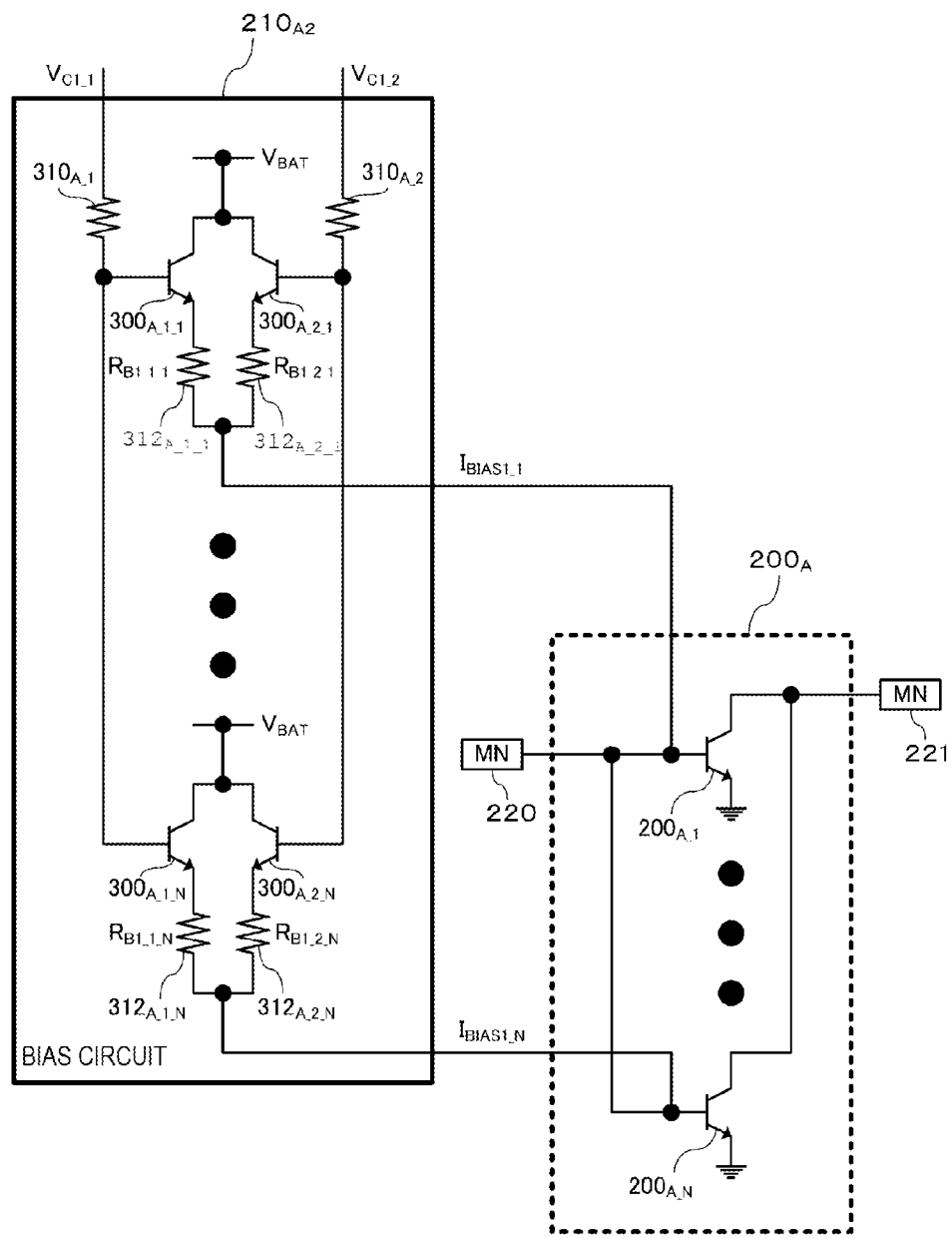
FIG. 5 illustrates an example of the configuration of a bias circuit when an amplifier transistor is a multi-finger transistor.

FIG. 5 illustrates an example of the configuration of the bias circuit $210_A$ ($210_{A2}$) when the amplifier transistor $200_A$ is a multi-finger transistor. Elements equivalent to those of the bias circuit $210_{A1}$ are designated by like reference numerals, and an explanation thereof will be omitted. When the amplifier transistor $200_B$ is a multi-finger transistor, the bias circuit $210_B$ may be configured similarly to the bias circuit $210_A$.

In the example shown in FIG. 5, the transistor $200_A$ is constituted by N unit transistors (fingers) $200_{A\_1}$ through $200_{A\_N}$ connected in parallel with each other. The bias circuit $210_{A2}$ includes the same number of pairs of transistors $300_{A\_1}$ and $300_{A\_2}$ (that is, transistors $300_{A\_1\_1}$ through $300_{A\_1\_N}$ and transistors $300_{A\_2\_1}$ through $300_{A\_2\_N}$, respectively) and the same number of pairs of resistors $312_{A\_1}$ and $312_{A\_2}$ (that is, resistors $312_{A\_1\_1}$ through $312_{A\_1\_N}$ and resistors $312_{A\_2\_1}$ through $312_{A\_2\_N}$, respectively), which are provided in the bias circuit $210_{A1}$, as the number (N) of fingers.

In the bias circuit $210_{A2}$, for example, when the bias control voltage $V_{C1\_1}$ is at a high level and the bias control voltage $V_{C1\_2}$ is at a low level, the transistors $300_{A\_1\_1}$ through $300_{A\_1\_N}$ are turned ON and the transistors $300_{A\_2\_1}$ through $300_{A\_2\_N}$ are turned OFF. In this case, the bias circuit $210_{A2}$ outputs the bias current $I_{BIAS1\_k}$ determined by the bias control voltage $V_{C1\_1}$ and the resistance value $R_{B1\_1\_k}$ to the transistor $200_{A\_k}$ (k=1 to N). When the bias control voltage $V_{C1\_1}$ is at a low level and the bias control voltage $V_{C1\_2}$ is at a high level, the transistors $300_{A\_1\_1}$ through $300_{A\_1\_N}$ are turned OFF and the transistors $300_{A\_2\_1}$ through $300_{A\_2\_N}$ are turned ON. In this case, the bias circuit $210_{A2}$ outputs the bias current $I_{BIAS1\_k}$ determined by the bias control voltage $V_{C1\_2}$ and the resistance value $R_{B1\_2\_k}$ to the transistor $200_{A\_k}$ (k=1 to N). With this configuration, it is possible to obtain advantages similar to those achieved by the bias circuit $210_{A1}$.

Figure 6:
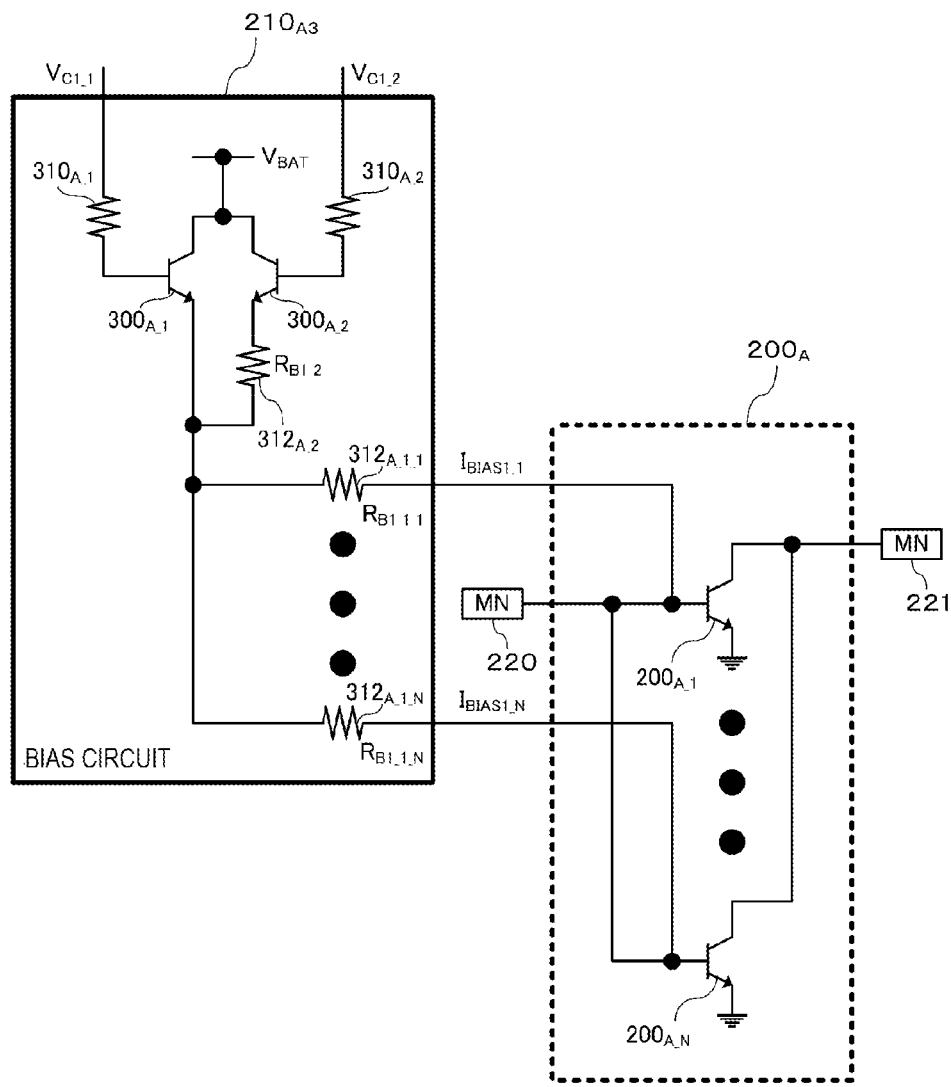
FIG. 6 illustrates another example of the configuration of the bias circuit when the amplifier transistor is a multi-finger transistor.

FIG. 6 illustrates an example of the configuration of the bias circuit $210_A$ ($210_{A3}$) when the amplifier transistor $200_A$ is a multi-finger transistor. Elements equivalent to those of the bias circuits $210_{A1}$ and $210_{A2}$ are designated by like reference numerals, and an explanation thereof will be omitted. When the amplifier transistor $200_B$ is a multi-finger transistor, the bias circuit $210_B$ may be configured similarly to the bias circuit $210_A$.

The bias circuit $210_{A3}$ shown in FIG. 6 includes the same number of resistors $312_{A\_1}$ (that is, $312_{A\_1\_1}$ through $312_{A\_1\_N}$), which are provided in the bias circuit $210_{A1}$, as the number (N) of fingers.

In the bias circuit $210_{A3}$, for example, when the bias control voltage $V_{C1\_1}$ is at a high level and the bias control voltage $V_{C1\_2}$ is at a low level, the transistor $300_{A\_1}$ is turned ON and the transistor $300_{A\_2}$ is turned OFF. In this case, the bias circuit $210_{A3}$ outputs the bias current $I_{BIAS1\_k}$ determined by the bias control voltage $V_{C1\_1}$ and the resistance value $R_{B1\_1\_k}$ to the transistor $200_{A\_k}$ (k=1 to N). When the bias control voltage $V_{C1\_1}$ is at a low level and the bias control voltage $V_{C1\_2}$ is at a high level, the transistor $300_{A\_1}$ is turned OFF and the transistor $300_{A\_2}$ is turned ON. In this case, the bias circuit $210_{A3}$ outputs the bias current $I_{BIAS1\_k}$ determined by the bias control voltage $V_{C1\_2}$ and the resistance values $R_{B1\_2}$ and $R_{B1\_1\_k}$ to the transistor $200_{A\_k}$ (k=1 to N). With this configuration, it is possible to obtain advantages similar to those achieved by the bias circuit $210_{A1}$.

Figure 7:
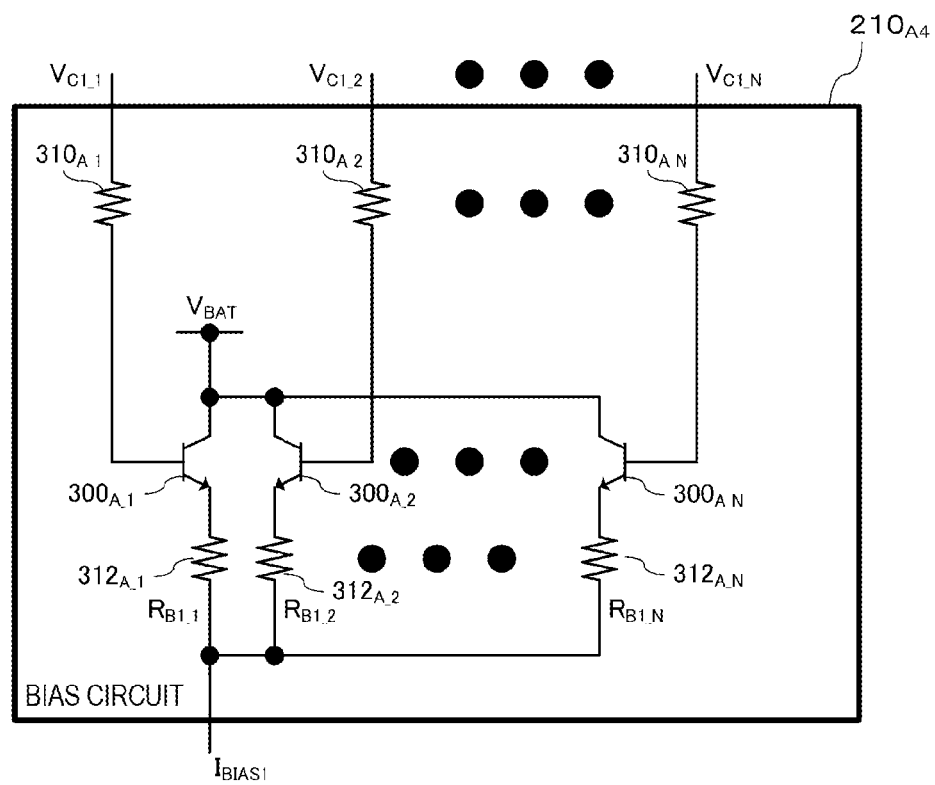
FIG. 7 illustrates an example of the configuration of the bias circuit.

FIG. 7 illustrates an example of the configuration of the bias circuit $210_A$ ($210_{A4}$). Elements equivalent to those of the bias circuit $210_{A1}$ are designated by like reference numerals, and an explanation thereof will be omitted. The bias circuit $210_B$ may be configured similarly to the bias circuit $210_A$.

In the example shown in FIG. 7, the bias circuit $210_{A4}$ includes N pairs of transistors $300_{A\_k}$ and resistors $312_{A\_k}$ (N>2). In accordance with the N pairs of transistors $300_{A\_k}$ and resistors $312_{A\_k}$, N bias control voltages ($V_{C1\_1}$ through $V_{C1\_N}$) are input from the bias control circuit 240 into the bias circuit $210_{A4}$.

In the bias circuit $210_{A4}$, for example, when the bias control voltage $V_{C1\_k}$ is at a high level and the other bias control voltages are at a low level, among the transistors $300_{A\_n}$ (n=1 to N), the transistor $300_{A\_k}$ is turned ON and the other transistors are turned OFF. In this case, the bias circuit $210_{A4}$ outputs the bias current $I_{BIAS1}$ determined by the bias control voltage $V_{C1\_k}$ and the resistance value $R_{B1\_k}$ to the transistor $200_A$ (k=1 to N). With this configuration, it is possible to obtain advantages similar to those achieved by the bias circuit $210_{A1}$.

Figure 8:
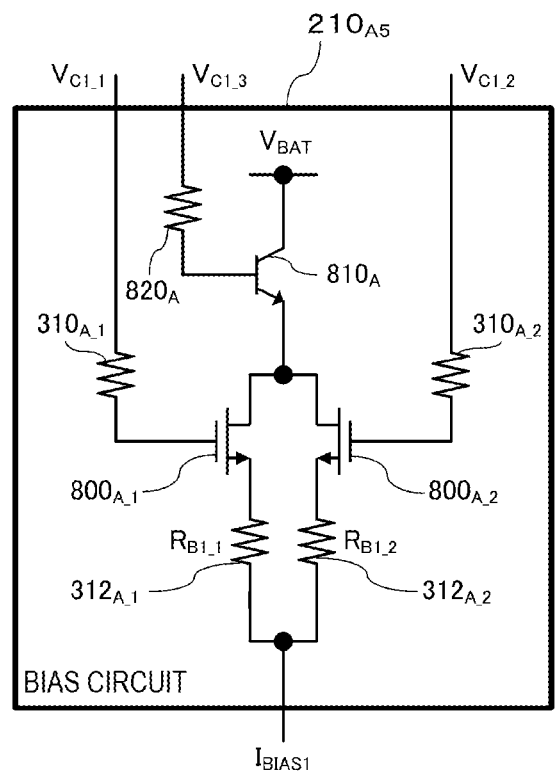
FIG. 8 illustrates another example of the configuration of the bias circuit.

FIG. 8 illustrates an example of the configuration of the bias circuit $210_A$ ($210_{A5}$). Elements equivalent to those of the bias circuit $210_{A1}$ are designated by like reference numerals, and an explanation thereof will be omitted. The bias circuit $210_B$ may be configured similarly to the bias circuit $210_A$.

The bias circuit $210_{A5}$ shown in FIG. 8 includes transistors $800_{A\_1}$ and $800_{A\_2}$ (first and second transistors) instead of the transistors $300_{A\_1}$ and $300_{A\_2}$ provided in the bias circuit $210_{A1}$. The bias circuit $210_{A5}$ also includes a transistor $810_A$ (third transistor) and a resistor $820_A$ (third resistor). In addition to the bias control voltages $V_{C1\_1}$ and $V_{C1\_2}$ (first and second bias control voltages), a bias control voltage $V_{C1\_3}$ (third bias control voltage) is also input from the bias control circuit 240 to the bias circuit $210_{A5}$.

The transistors $800_{A\_1}$ and $800_{A\_2}$ are field-effect transistors (FETs). The bias control voltage $V_{C1\_1}$ is supplied to the gate of the transistor $800_{A\_1}$ via the resistor $310_{A\_1}$. The bias control voltage $V_{C1\_2}$ is supplied to the gate of the transistor $800_{A\_2}$ via the resistor $310_{A\_2}$. The drains of the transistors $800_{A\_1}$ and $800_{A\_2}$ are connected to the emitter of the transistor $810_A$. The sources of the transistors $800_{A\_1}$ and $800_{A\_2}$ are connected to the resistors $312_{A\_1}$ and $312_{A\_2}$, respectively.

The transistor $810_A$ is a bipolar transistor, for example, an HBT. The bias control voltage $V_{C1\_3}$ is supplied to the base of the transistor $810_A$ via the resistor $820_A$. A power supply voltage of a predetermined level, for example the battery voltage $V_{BAT}$, is supplied to the collector of the transistor $810_A$. The emitter of the transistor $810_A$ is connected to the drains of the transistors $800_{A\_1}$ and $800_{A\_2}$. That is, the transistor $810_A$ is connected in series with the transistors $800_{A\_1}$ and $800_{A\_2}$.

In the bias circuit $210_{A5}$, one of the transistors $800_{A\_1}$ and $800_{A\_2}$ is turned ON under the control of the bias control voltages $V_{C1\_1}$ and $V_{C1\_2}$. Additionally, in the bias circuit $210_{A5}$, under the control of the bias control voltage $V_{C1\_3}$, the currents to be supplied to the transistors $800_{A\_1}$ and $800_{A\_2}$ are controlled. For example, when the bias control voltage $V_{C1\_1}$ is at a high level and the bias control voltage $V_{C1\_2}$ is at a low level, the transistor $800_{A\_1}$ is turned ON and the transistor $800_{A\_2}$ is turned OFF. In this case, the bias circuit $210_{A5}$ outputs the bias current $I_{BIAS1}$ determined by the bias control voltages $V_{C1\_1}$ and $V_{C1\_3}$ and the resistance value $R_{B1\_1}$. When the bias control voltage $V_{C1\_1}$ is at a low level and the bias control voltage $V_{C1\_2}$ is at a high level, the transistor $800_{A\_1}$ is turned OFF and the transistor $800_{A\_2}$ is turned ON. In this case, the bias circuit $210_{A5}$ outputs the bias current $I_{BIAS1}$ determined by the bias control voltages $V_{C1\_2}$ and $V_{C1\_3}$ and the resistance value $R_{B1\_2}$. With this configuration, it is possible to obtain advantages similar to those achieved by the bias circuit $210_{A1}$.

Figure 9:
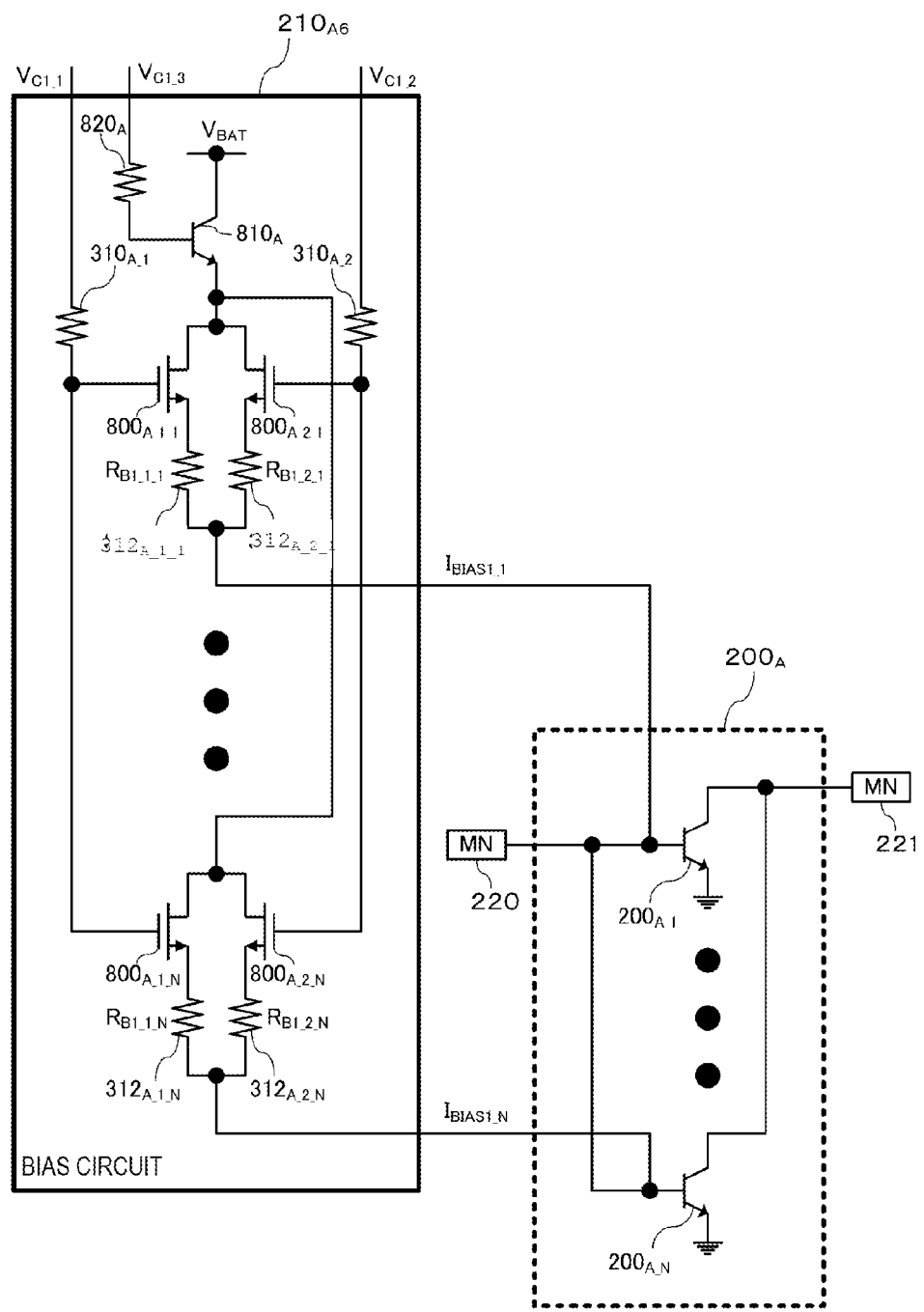
FIG. 9 illustrates another example of the configuration of the bias circuit when the amplifier transistor is a multi-finger transistor.

FIG. 9 illustrates an example of the configuration of the bias circuit $210_A$ ($210_{A6}$) when the amplifier transistor $200_A$ is a multi-finger transistor. Elements equivalent to those of the bias circuits $210_{A2}$ and $210_{A5}$ are designated by like reference numerals, and an explanation thereof will be omitted. When the amplifier transistor $200_B$ is a multi-finger transistor, the bias circuit $210_B$ may be configured similarly to the bias circuit $210_A$.

The bias circuit $210_{A6}$ shown in FIG. 9 includes the same number of pairs of transistors $800_{A\_1}$ and $800_{A\_2}$ (that is, transistors $800_{A\_1\_1}$ through $800_{A\_1\_N}$ and transistors $800_{A\_2\_1}$ through $800_{A\_2\_N}$, respectively) and the same number of pairs of resistors $312_{A\_1}$ and $312_{A\_2}$ (that is, resistors $312_{A\_1\_1}$ through $312_{A\_1\_N}$ and resistors $312_{A\_2\_1}$ through $312_{A\_2\_N}$, respectively), which are provided in the bias circuit $210_{A5}$, as the number (N) of fingers.

In the bias circuit $210_{A6}$, for example, when the bias control voltage $V_{C1\_1}$ is at a high level and the bias control voltage $V_{C1\_2}$ is at a low level, the transistor $800_{A\_1\_k}$ is turned ON and the transistor $800_{A\_2\_k}$ is turned OFF (k=1 to N). In this case, the bias circuit $210_{A6}$ outputs the bias current $I_{BIAS\_k}$ determined by the bias control voltages $V_{C1\_1}$ and $V_{C1\_3}$ and the resistance value $R_{B1\_1\_k}$ to the transistor $200_{A\_k}$ (k=1 to N). When the bias control voltage $V_{C1\_1}$ is at a low level and the bias control voltage $V_{C1\_2}$ is at a high level, the transistor $800_{A\_1\_k}$ is turned OFF and the transistor $800_{A\_2\_k}$ is turned ON (k=1 to N). In this case, the bias circuit $210_{A6}$ outputs the bias current $I_{BIAS1\_k}$ determined by the bias control voltages $V_{C1\_2}$ and $V_{C1\_3}$ and the resistance value $R_{B1\_2\_k}$ to the transistor $200_{A\_k}$ (k=1 to N). With this configuration, it is possible to obtain advantages similar to those achieved by the bias circuit $210_{A1}$.

Figure 10:
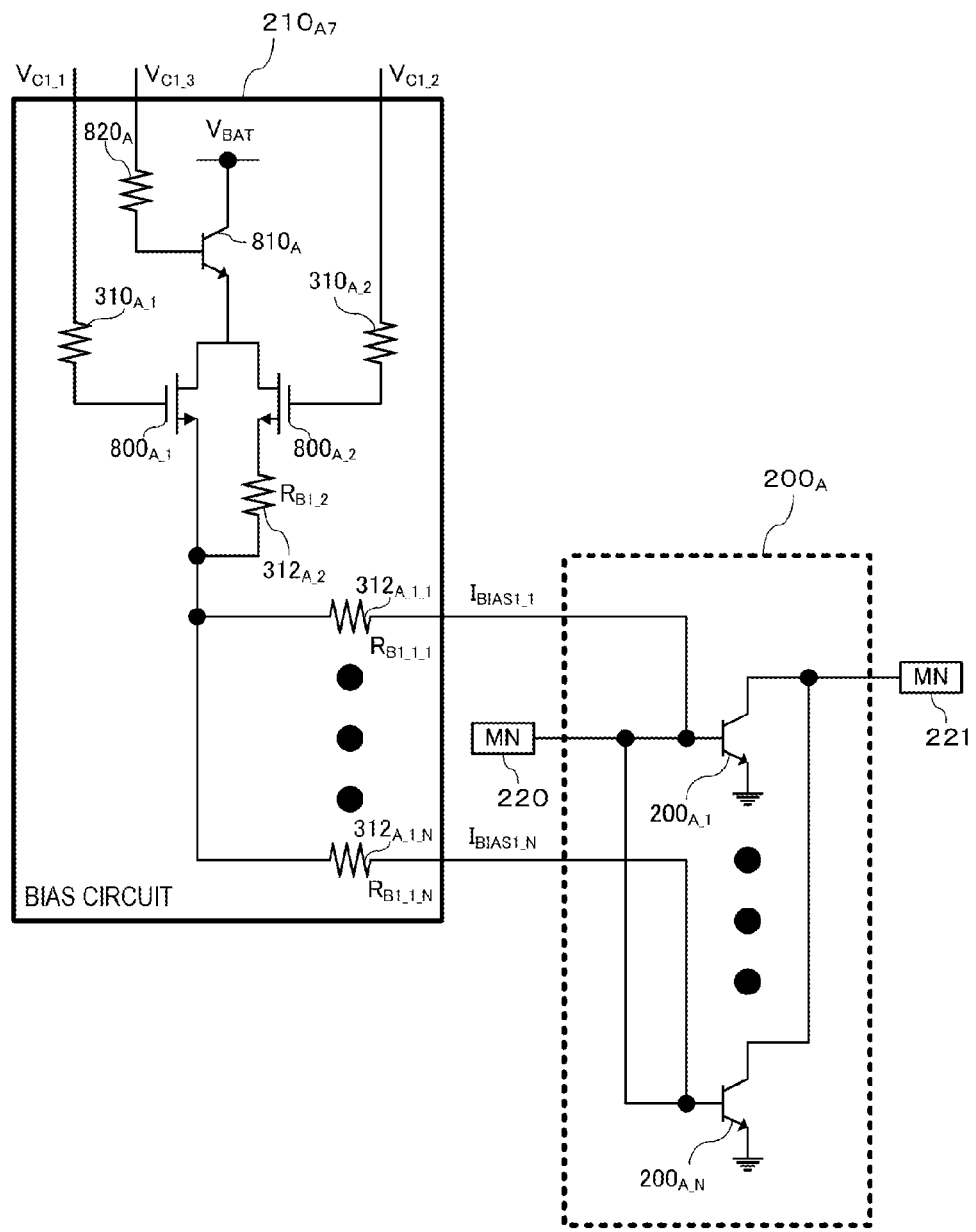
FIG. 10 illustrates another example of the configuration of the bias circuit when the amplifier transistor is a multi-finger transistor.

FIG. 10 illustrates an example of the configuration of the bias circuit $210_A$ ($210_{A7}$) when the amplifier transistor $200_A$ is a multi-finger transistor. Elements equivalent to those of the bias circuits $210_{A3}$ and $210_{A5}$ are designated by like reference numerals, and an explanation thereof will be omitted. When the amplifier transistor $200_B$ is a multi-finger transistor, the bias circuit $210_B$ may be configured similarly to the bias circuit $210_A$.

The bias circuit $210_{A7}$ shown in FIG. 10 includes the same number of resistors $312_{A\_1}$ (that is, $312_{A\_1\_1}$ through $312_{A\_1\_N}$), which are provided in the bias circuit $210_{A5}$, as the number (N) of fingers.

In the bias circuit $210_{A7}$, for example, when the bias control voltage $V_{C1\_1}$ is at a high level and the bias control voltage $V_{C1\_2}$ is at a low level, the transistor $800_{A\_1}$ is turned ON and the transistor $800_{A\_2}$ is turned OFF. In this case, the bias circuit $210_{A7}$ outputs the bias current $I_{BIAS1\_k}$ determined by the bias control voltages $V_{C1\_1}$ and $V_{C1\_3}$ and the resistance value $R_{B1\_1\_k}$ to the transistor $200_{A\_k}$ (k=1 to N). When the bias control voltage $V_{C1\_1}$ is at a low level and the bias control voltage $V_{C1\_2}$ is at a high level, the transistor $800_{A\_1}$ is turned OFF and the transistor $800_{A\_2}$ is turned ON. In this case, the bias circuit $210_{A7}$ outputs the bias current $I_{BIAS1\_k}$ determined by the bias control voltages $V_{C1\_2}$ and $V_{C1\_3}$ and the resistance values $R_{B1\_2}$ and $R_{B1\_1\_k}$ to the transistor $200_{A\_k}$ (k=1 to N). With this configuration, it is possible to obtain advantages similar to those achieved by the bias circuit $210_{A1}$.

Figure 11:
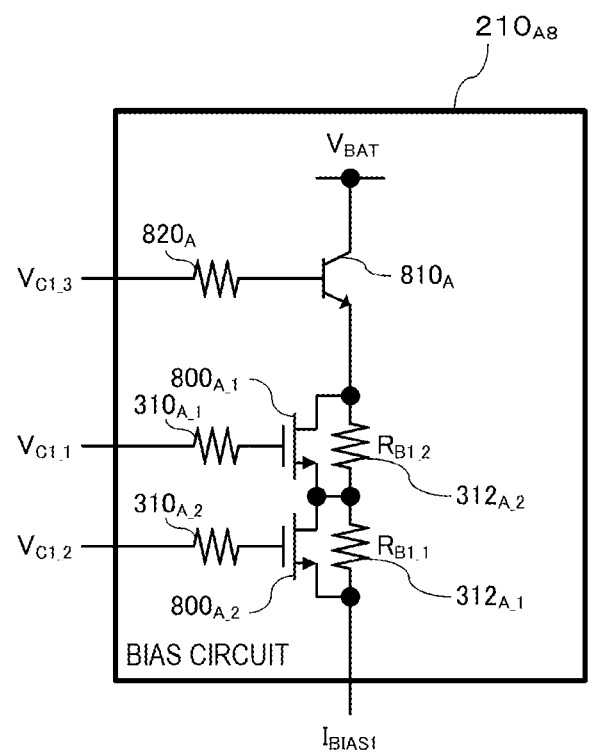
FIG. 11 illustrates another example of the configuration of the bias circuit.

FIG. 11 illustrates an example of the configuration of the bias circuit $210_A$ ($210_{A8}$). Elements equivalent to those of the bias circuit $210_{A5}$ are designated by like reference numerals, and an explanation thereof will be omitted. The bias circuit $210_B$ may be configured similarly to the bias circuit $210_A$.

The bias circuit $210_{A8}$ is a modified example of the bias circuit $210_{A5}$. In the bias circuit $210_{A8}$, resistors $312_{A\_1}$ and $312_{A\_2}$ connected in series with each other are connected to the emitter of the transistor $810_A$. The drain of the transistor $800_{A\_1}$ is connected to one end of the resistor $312_{A\_2}$ and the source thereof is connected to the other end of the resistor $312_{A\_2}$. The drain of the transistor $800_{A\_2}$ is connected to one end of the resistor $312_{A\_1}$ and the source thereof is connected to the other end of the resistor $312_{A\_1}$.

In the bias circuit $210_{A8}$, for example, when the bias control voltage $V_{C1\_1}$ is at a high level and the bias control voltage $V_{C1\_2}$ is at a low level, the transistor $800_{A\_1}$ is turned ON and the transistor $800_{A\_2}$ is turned OFF. In this case, the bias circuit $210_{A8}$ outputs the bias current $I_{BIAS1}$ determined by the bias control voltages $V_{C1\_1}$ and $V_{C1\_3}$ and the resistance value $R_{B1\_2}$. When the bias control voltage $V_{C1\_1}$ is at a low level and the bias control voltage $V_{C1\_2}$ is at a high level, the transistor $800_{A\_1}$ is turned OFF and the transistor $800_{A\_2}$ is turned ON. In this case, the bias circuit $210_{A8}$ outputs the bias current $I_{BIAS1}$ determined by the bias control voltages $V_{C1\_2}$ and $V_{C1\_3}$ and the resistance value $R_{B1\_2}$. With this configuration, it is possible to obtain advantages similar to those achieved by the bias circuit $210_{A1}$.

Figure 12:
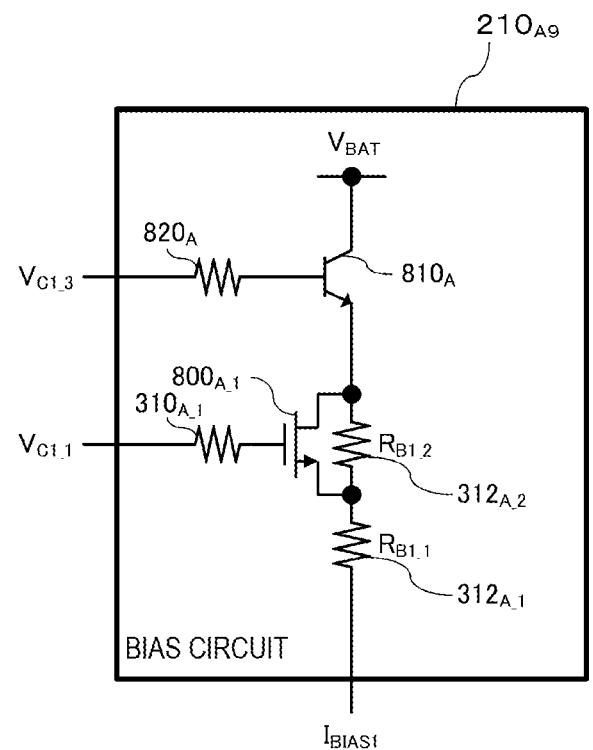
FIG. 12 illustrates another example of the configuration of the bias circuit.

FIG. 12 illustrates an example of the configuration of the bias circuit $210_A$ ($210_{A9}$). Elements equivalent to those of the bias circuit $210_{A8}$ are designated by like reference numerals, and an explanation thereof will be omitted. The bias circuit $210_B$ may be configured similarly to the bias circuit $210_A$.

The bias circuit $210_{A9}$ is a modified example of the bias circuit $210_{A8}$. The configuration of the bias circuit $210_{A9}$ is the same configuration as the bias circuit $210_{A8}$, except that bias circuit $210_{A9}$ does not include the resistor $310_{A\_2}$ and the transistor $800_{A\_2}$ provided in the bias circuit $210_{A8}$.

In the bias circuit $210_{A9}$, for example, when the bias control voltage $V_{C1\_1}$ is at a high level, the transistor $800_{A\_1}$ is turned ON. In this case, the bias circuit $210_{A9}$ outputs the bias current $I_{BIAS1}$ determined by the bias control voltage $V_{C1\_1}$ and the resistance value $R_{B1\_1}$. When the bias control voltage $V_{C1\_1}$ is at a low level, the transistor $800_{A\_1}$ is turned OFF. In this case, the bias circuit $210_{A9}$ outputs the bias current $I_{BIAS1}$ determined by the bias control voltage $V_{C1\_3}$ and the resistance values $R_{B1\_1}$ and $R_{B1\_2}$. With this configuration, it is possible to obtain advantages similar to those achieved by the bias circuit $210_{A1}$.

Figure 13:
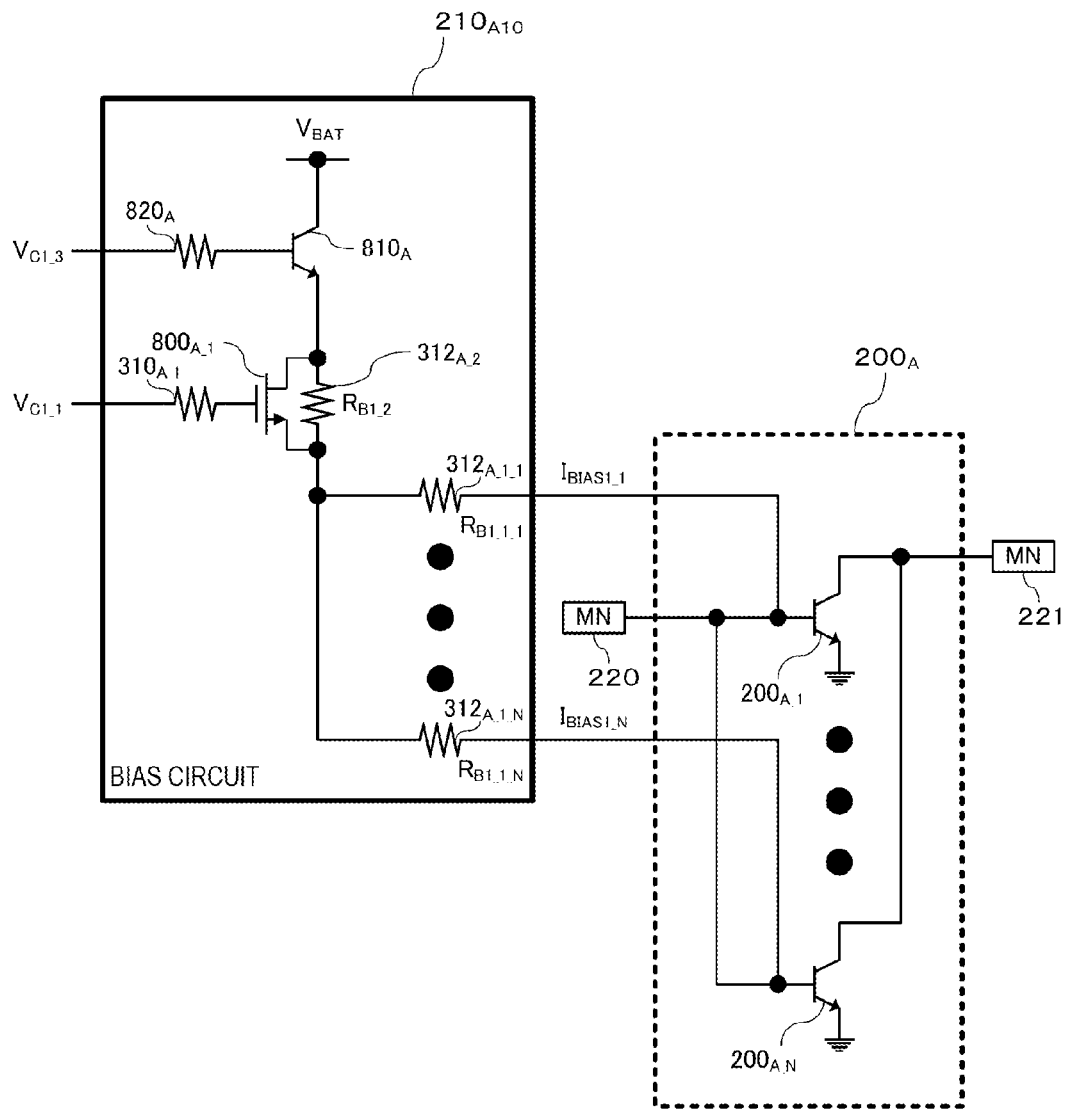
FIG. 13 illustrates another example of the configuration of the bias circuit when the amplifier transistor is a multi-finger transistor.

FIG. 13 illustrates an example of the configuration of the bias circuit $210_A$ ($210_{A10}$) when the amplifier transistor $200_A$ is a multi-finger transistor. Elements equivalent to those of the bias circuits $210_{A7}$ and $210_{A9}$ are designated by like reference numerals, and an explanation thereof will be omitted. When the amplifier transistor $200_B$ is a multi-finger transistor, the bias circuit $210_B$ may be configured similarly to the bias circuit $210_A$.

The bias circuit $210_{A10}$ shown in FIG. 13 includes the same number of resistors $312_{A\_1}$ (that is, $312_{A\_1\_1}$ through $312_{A\_1\_N}$), the resistor $312_{A\_1}$ being provided in the bias circuit $210_{A9}$, as the number (N) of fingers.

In the bias circuit $210_{A10}$, for example, when the bias control voltage $V_{C1\_1}$ is at a high level, the transistor $800_{A\_1}$ is turned ON. In this case, the bias circuit $210_{A10}$ outputs the bias current $I_{BIAS1\_k}$ determined by the bias control voltage $V_{C1\_1}$ and the resistance value $R_{B1\_1\_k}$ to the transistor $200_{A\_k}$ (k=1 to N). When the bias control voltage $V_{C1\_1}$ is at a low level, the transistor $800_{A\_1}$ is turned OFF. In this case, the bias circuit $210_{A10}$ outputs the bias current $I_{BIAS1\_k}$ determined by the bias control voltage $V_{C1\_3}$ and the resistance values $R_{B1\_2}$ and $R_{B1\_1\_k}$ to the transistor $200_{A\_k}$ (k=1 to N). With this configuration, it is possible to obtain advantages similar to those achieved by the bias circuit $210_{A1}$.

Figure 14:
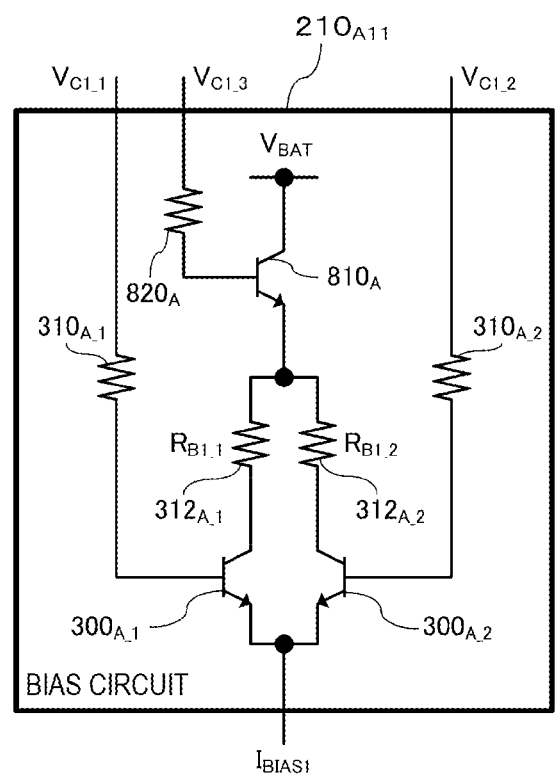
FIG. 14 illustrates another example of the configuration of the bias circuit.

FIG. 14 illustrates an example of the configuration of the bias circuit $210_A$ ($210_{A11}$). Elements equivalent to those of the bias circuits $210_{A1}$ and $210_{A5}$ are designated by like reference numerals, and an explanation thereof will be omitted. The bias circuit $210_B$ may be configured similarly to the bias circuit $210_A$.

The bias circuit $210_{A11}$ shown in FIG. 14 includes transistors $300_{A\_1}$ and $300_{A\_2}$ instead of the transistors $800_{A\_1}$ and $800_{A\_2}$ provided in the bias circuit $210_{A5}$.

The collector of the transistor $300_{A\_1}$ is connected to the emitter of the transistor $810_A$ via the resistor $312_{A\_1}$, and the emitter thereof is connected to the transistor $200_A$. The collector of the transistor $300_{A\_2}$ is connected to the emitter of the transistor $810_A$ via the resistor $312_{A\_2}$, and the emitter thereof is connected to the transistor $200_A$.

In the bias circuit $210_{A11}$, one of the transistors $300_{A\_1}$ and $300_{A\_2}$ is turned ON under the control of the bias control voltages $V_{C1\_1}$ and $V_{C1\_2}$. Additionally, in the bias circuit $210_{A11}$, under the control of the bias control voltage $V_{C1\_3}$, the currents to be supplied to the transistors $300_{A\_1}$ and $300_{A\_2}$ are controlled. For example, when the bias control voltage $V_{C1\_1}$ is at a high level and the bias control voltage $V_{C1\_2}$ is at a low level, the transistor $300_{A\_1}$ is turned ON and the transistor $300_{A\_2}$ is turned OFF. In this case, the bias circuit $210_{A11}$ outputs the bias current $I_{BIAS1}$ determined by the bias control voltages $V_{C1\_1}$ and $V_{C1\_3}$ and the resistance value $R_{B1\_1}$. When the bias control voltage $V_{C1\_1}$ is at a low level and the bias control voltage $V_{C1\_2}$ is at a high level, the transistor $300_{A\_1}$ is turned OFF and the transistor $300_{A\_2}$ is turned ON. In this case, the bias circuit $210_{A11}$ outputs the bias current $I_{BIAS1}$ determined by the bias control voltages $V_{C1\_2}$ and $V_{C1\_3}$ and the resistance value $R_{B1\_2}$. With this configuration, it is possible to obtain advantages similar to those achieved by the bias circuit $210_{A1}$.

Figure 15:
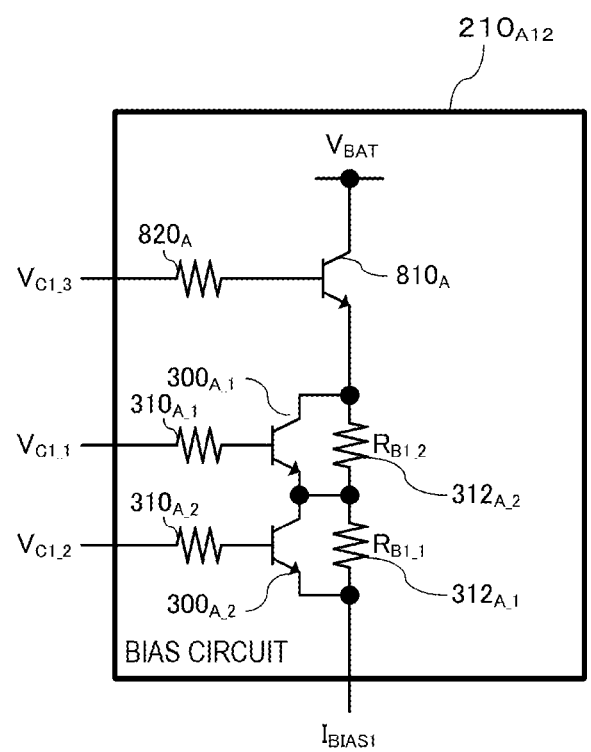
FIG. 15 illustrates another example of the configuration of the bias circuit.

FIG. 15 illustrates an example of the configuration of the bias circuit $210_A$ ($210_{A12}$). Elements equivalent to those of the bias circuit $210_{A8}$ are designated by like reference numerals, and an explanation thereof will be omitted. The bias circuit $210_B$ may be configured similarly to the bias circuit $210_A$.

The bias circuit $210_{A12}$ is a modified example of the bias circuit $210_{A8}$. The bias circuit $210_{A12}$ includes transistors $300_{A\_1}$ and $300_{A\_2}$ instead of the transistors $800_{A\_1}$ and $800_{A\_2}$ provided in the bias circuit $210_{A8}$. The collector of the transistor $300_{A\_1}$ is connected to one end of the resistor $312_{A\_2}$ and the emitter thereof is connected to the other end of the resistor $312_{A\_2}$. The collector of the transistor $300_{A\_2}$ is connected to one end of the resistor $312_{A\_1}$ and the emitter thereof is connected to the other end of the resistor $312_{A\_1}$.

In the bias circuit $210_{A12}$, for example, when the bias control voltage $V_{C1\_1}$ is at a high level and the bias control voltage $V_{C1\_2}$ is at a low level, the transistor $300_{A\_1}$ is turned ON and the transistor $300_{A\_2}$ is turned OFF. In this case, the bias circuit $210_{A12}$ outputs the bias current $I_{BIAS1}$ determined by the bias control voltages $V_{C1\_1}$ and $V_{C1\_3}$ and the resistance value $R_{B1\_1}$. When the bias control voltage $V_{C1\_1}$ is at a low level and the bias control voltage $V_{C1\_2}$ is at a high level, the transistor $300_{A\_1}$ is turned OFF and the transistor $300_{A\_2}$ is turned ON. In this case, the bias circuit $210_{A12}$ outputs the bias current $I_{BIAS1}$ determined by the bias control voltages $V_{C1\_2}$ and $V_{C1\_3}$ and the resistance value $R_{B1\_2}$. With this configuration, it is possible to obtain advantages similar to those achieved by the bias circuit $210_{A1}$.

An exemplary embodiment of the disclosure has been discussed above. In the power amplifier module 113 including one of the bias circuits $210A_1$ through $210A_8$, $210A_{11}$, and $210A_{12}$, the ON state and the OFF state of two transistors are complementarily switched under the control of the bias control voltage $V_{C1\_1}$ supplied in a first operation mode (for example, the ET mode) and the bias control voltage $V_{C1\_2}$ supplied in a second operation mode (for example, the APT mode). Accordingly, the power amplifier module 113 is able to generate a bias current determined by the corresponding bias control voltage and resistance value based on the operation mode. It is thus possible to suitably control bias to be supplied to an amplifier transistor in a power amplifier module that is operable in multiple operation modes.

In the power amplifier module 113 including one of the bias circuits $210A_5$ through $210A_8$, $210A_{11}$, and $210A_{12}$, the ON state and the OFF state of two transistors are complementarily switched under the control of the bias control voltages $V_{C1\_1}$ and $V_{C1\_2}$, and also, the currents supplied to these transistors are controlled by using the bias control voltage $V_{C1\_3}$. Accordingly, the power amplifier module 113 is able to generate a bias current determined by the corresponding bias control voltages and resistance value based on the operation mode. It is thus possible to suitably control bias to be supplied to an amplifier transistor in a power amplifier module that is operable in multiple operation modes.

In the power amplifier module 113 including one of the bias circuits $210A_9$ and $210A_{10}$, the ON state and the OFF state of a transistor are switched under the control of the bias control voltage $V_{C1\_1}$ supplied in the first operation mode (for example, the ET mode), and also, the current supplied to this transistor is controlled by using the bias control voltage $V_{C1\_3}$. Accordingly, the power amplifier module 113 is able to generate a bias current determined by the corresponding bias control voltage and resistance value based on the operation mode. It is thus possible to suitably control bias to be supplied to an amplifier transistor in a power amplifier module that is operable in multiple operation modes.

The embodiment described above is provided for facilitating the understanding of the invention, but is not intended to be exhaustive or to limit the invention to the precise forms disclosed. Modifications and/or improvements may be made to the invention without departing from the scope and spirit of the invention, and equivalents of the invention are also encompassed in the invention. That is, suitable design changes made to the embodiment by those skilled in the art are also encompassed in the invention as long as they are within the scope and spirit of the invention. For example, the elements of the embodiment and the positions, materials, conditions, configurations, and sizes thereof are not restricted to those described in the embodiment and may be changed in an appropriate manner. The elements of the embodiment may be combined as long as such combinations are technically possible, and configurations obtained by combining the elements of the embodiment are also encompassed in the invention as long as they are within the scope and spirit of the invention.

While embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A power amplifier module comprising:
   an amplifier transistor to which a first power supply voltage or a second power supply voltage is supplied based on a mode signal supplied to the power amplifier module, the amplifier transistor receiving a first signal and outputting a second signal obtained by amplifying the first signal; and
   a bias circuit that supplies a bias current to the amplifier transistor,
   the bias circuit including
      a first resistor,
      a first transistor that is connected in series with the first resistor and that is turned ON by a first bias control voltage which is supplied when the mode signal indicates that a first operation mode is to be used to amplify the first signal, a second resistor, and a second transistor that is connected in series with the second resistor and that is turned ON by a second bias control voltage which is supplied when the mode signal indicates that a second operation mode is to be used to amplify the first signal.

2. The power amplifier module according to claim 1, further comprising:

a bias control circuit that outputs the first bias control voltage and the second bias control voltage.

3. The power amplifier module according to claim 1, wherein the bias circuit further includes a third transistor that is connected in series with the first and second transistors and that is turned ON by a third bias control voltage which is supplied when the first or second operation mode is used.

4. The power amplifier module according to claim 3, further comprising:

a bias control circuit that outputs the first bias control voltage, the second bias control voltage, and the third bias control voltage.

5. A power amplifier module comprising:

an amplifier transistor to which a first power supply voltage or a second power supply voltage is supplied based on a mode signal supplied to the power amplifier module, the amplifier transistor receiving a first signal and outputting a second signal obtained by amplifying the first signal; and a bias circuit that supplies a bias current to the amplifier transistor, the bias circuit including a first resistor, a first transistor that is connected in series with the first resistor and that is turned ON by a first bias control voltage which is supplied when the mode signal indicates that a first operation mode is to be used to amplify the first signal, a second resistor that is connected in series with the first resistor and that is connected in parallel with the first transistor, and a third transistor that is connected in series with the first transistor and that is turned ON by a third bias control voltage which is supplied when the first operation mode or a second operation mode is used to amplify the first signal.

6. The power amplifier module according to claim 5, further comprising:

a bias control circuit that outputs the first bias control voltage and third bias control voltage.

7. The power amplifier module according to claim 1, wherein the first operation mode is an envelope tracking mode, and the second operation mode is an average power tracking mode.

8. The power amplifier module according to claim 5, wherein the first operation mode is an envelope tracking mode, and the second operation mode is an average power tracking mode.

9. The power amplifier module according to claim 1, wherein when the amplifier transistor is a multi-finger transistor having N fingers, the bias circuit includes N pairs of the first transistor and the second transistor.

10. The power amplifier module according to claim 9, wherein the N pairs of the first transistor and the second transistor are connected in parallel.

11. The power amplifier module according to claim 1, wherein the power amplifier module is a multi-stage amplifier comprising a plurality of amplifier transistors and a plurality of bias circuits corresponding to the plurality of amplifier transistors.

12. The power amplifier module according to claim 5, wherein the power amplifier module is a multi-stage amplifier comprising a plurality of amplifier transistors and a plurality of bias circuits corresponding to the plurality of amplifier transistors.

13. The power amplifier module according to claim 7, wherein the first resistor and the first bias control voltage have values selected in accordance with providing the bias current for the envelope tracking mode and the second resistor and the second bias control voltage have values selected in accordance with providing the bias current for the average power tracking mode.

14. The power amplifier module according to claim 8, wherein the first resistor and the first bias control voltage have values selected in accordance with providing the bias current for the envelope tracking mode and the first resistor, the second resistor, and the third bias control voltage have values selected in accordance with providing the bias current for the average power tracking mode.

15. The power amplifier module according to claim 7, wherein the first bias control voltage is greater than the second bias control voltage.

16. The power amplifier module according to claim 1, wherein when the amplifier transistor is a multi-finger transistor having N fingers, the bias circuit includes one pair of the first transistor and the second transistor.

17. The power amplifier module according to claim 16, wherein the one pair of the first transistor and the second transistor are connected in parallel.

18. The power amplifier module according to claim 16, wherein the power amplifier module is a multi-stage amplifier comprising a plurality of amplifier transistors and a plurality of bias circuits corresponding to the plurality of amplifier transistors.

* * * * *

UNITED STATES PATENT AND TRADEMARK OFFICE
CERTIFICATE OF CORRECTION

PATENT NO. : 9,660,589 B2  
APPLICATION NO. : 15/077124  
DATED : May 23, 2017  
INVENTOR(S) : Masao Kondo et al.

Page 1 of 1

It is certified that error appears in the above-identified patent and that said Letters Patent is hereby corrected as shown below:

In the Specification

Column 10, Line 1, "resistance value $RB_{1\_2}$." should read --resistance value $R_{B1\_1}$.--

Signed and Sealed this  
Third Day of October, 2017

Joseph Matal  
*Performing the Functions and Duties of the*  
*Under Secretary of Commerce for Intellectual Property and*  
*Director of the United States Patent and Trademark Office*